United States Patent
Bjorkman et al.

(10) Patent No.: US 6,669,858 B2
(45) Date of Patent: *Dec. 30, 2003

(54) INTEGRATED LOW K DIELECTRICS AND ETCH STOPS

(75) Inventors: Claes H. Bjorkman, Mountain View, CA (US); Min Melissa Yu, San Jose, CA (US); Hongquing Shan, San Jose, CA (US); David W. Cheung, Foster City, CA (US); Wai-Fan Yau, Mountain View, CA (US); Kuowei Liu, Santa Clara, CA (US); Nasreen Gazala Chapra, Menlo Park, CA (US); Gerald Yin, Cupertino, CA (US); Farhad K. Moghadam, Saratoga, CA (US); Judy H. Huang, Los Gatos, CA (US); Dennis Yost, Los Gatos, CA (US); Betty Tang, San Jose, CA (US); Yunsang Kim, Santa Clara, CA (US)

(73) Assignee: Applied Materials Inc., Santa Clara, CA (US)

(*) Notice: Subject to any disclaimer, the term of this patent is extended or adjusted under 35 U.S.C. 154(b) by 60 days.

This patent is subject to a terminal disclaimer.

(21) Appl. No.: 10/011,369

(22) Filed: Nov. 5, 2001

(65) Prior Publication Data

US 2002/0084257 A1 Jul. 4, 2002

Related U.S. Application Data

(63) Continuation of application No. 09/329,012, filed on Jun. 9, 1999, now Pat. No. 6,340,435, which is a continuation-in-part of application No. 09/021,788, filed on Feb. 11, 1998, now Pat. No. 6,054,379, and a continuation-in-part of application No. 09/162,915, filed on Sep. 29, 1998, now Pat. No. 6,287,990, and a continuation-in-part of application No. 09/185,555, filed on Nov. 4, 1998, now Pat. No. 6,303,523.

(51) Int. Cl.[7] ................................................. B44C 1/22
(52) U.S. Cl. ............................ 216/72; 216/13; 216/17; 216/64; 216/74; 438/706; 438/735; 438/737; 438/738; 438/740; 438/778; 438/779
(58) Field of Search .............................. 216/13, 17, 18, 216/64, 72, 74, 76; 438/689, 702, 780, 706, 735, 737, 738, 740, 778, 779

(56) References Cited

U.S. PATENT DOCUMENTS 4,808,259 A * 2/1989 Jillie et al. ................... 438/593

(List continued on next page.)

FOREIGN PATENT DOCUMENTS

DE 19654737 A1 7/1997 ........... H01L/21/31

(List continued on next page.)

OTHER PUBLICATIONS

C.D. Dobson, et al., "Advanced $SiO_2$ Planarization Using Silane and $H_2O_2$", Semiconductor International (Dec. 1994), pp. 85–87.

(List continued on next page.)

Primary Examiner—Randy Gulakowski
Assistant Examiner—M. Kornakov
(74) Attorney, Agent, or Firm—Moser, Patterson & Sheridan

(57) ABSTRACT

A method of depositing and etching dielectric layers having low dielectric constants and etch rates that vary by at least 3:1 for formation of horizontal interconnects. The amount of carbon or hydrogen in the dielectric layer is varied by changes in deposition conditions to provide low k dielectric layers that can replace etch stop layers or conventional dielectric layers in damascene applications. A dual damascene structure having two or more dielectric layers with dielectric constants lower than about 4 can be deposited in a single reactor and then etched to form vertical and horizontal interconnects by varying the concentration of a carbon:oxygen gas such as carbon monoxide. The etch gases for forming vertical interconnects preferably comprises CO and a fluorocarbon, and CO is preferably excluded from etch gases for forming horizontal interconnects.

14 Claims, 7 Drawing Sheets

U.S. PATENT DOCUMENTS

| | | | |
|---|---|---|---|
| 4,900,591 A | | 2/1990 | Bennett et al. ............. 427/255 |
| 5,204,141 A | | 4/1993 | Roberts et al. .......... 427/255.3 |
| 5,262,279 A | | 11/1993 | Tsang et al. ................ 430/311 |
| 5,302,236 A | | 4/1994 | Tahara et al. ............... 156/643 |
| 5,356,515 A | | 10/1994 | Tahara et al. ............... 156/643 |
| 5,360,646 A | | 11/1994 | Morita ....................... 427/574 |
| 5,389,581 A | * | 2/1995 | Freiberger et al. .......... 438/622 |
| 5,486,493 A | | 1/1996 | Jeng .......................... 437/195 |
| 5,488,015 A | | 1/1996 | Havemann et al. ......... 437/195 |
| 5,492,736 A | | 2/1996 | Laxman et al. ............. 427/579 |
| 5,559,055 A | | 9/1996 | Chang et al. ............... 437/195 |
| 5,591,677 A | | 1/1997 | Jeng .......................... 437/195 |
| 5,593,741 A | | 1/1997 | Ikeda ......................... 427/579 |
| 5,660,738 A | | 8/1997 | Hunter, Jr. et al. ........... 216/17 |
| 5,679,608 A | | 10/1997 | Cheung et al. ............. 437/195 |
| 5,700,720 A | | 12/1997 | Hashimoto .................. 437/195 |
| 5,789,319 A | | 8/1998 | Havemann et al. ......... 438/668 |
| 5,807,785 A | | 9/1998 | Ravi .......................... 438/624 |
| 5,834,847 A | | 11/1998 | Jung et al. .................. 257/773 |
| 5,908,672 A | * | 6/1999 | Ryu et al. ................... 427/574 |
| 5,968,324 A | * | 10/1999 | Cheung et al. ......... 204/192.28 |
| 6,035,803 A | * | 3/2000 | Robles et al. ............. 118/723 E |
| 6,054,206 A | | 4/2000 | Mountsier ................ 428/312.8 |
| 6,077,764 A | * | 6/2000 | Sugiarto et al. ............ 438/597 |
| 6,083,852 A | * | 7/2000 | Cheung et al. ............. 438/791 |
| 6,124,641 A | | 9/2000 | Matsuura .................... 257/759 |
| 6,127,262 A | * | 10/2000 | Huang et al. ............... 438/634 |
| 6,140,226 A | | 10/2000 | Grill et al. .................. 438/637 |
| 6,147,009 A | | 11/2000 | Grill et al. .................. 438/780 |
| 6,156,149 A | * | 12/2000 | Cheung et al. ........... 156/272.2 |
| 6,159,871 A | | 12/2000 | Loboda et al. .............. 438/786 |
| 6,169,021 B1 | | 1/2001 | Akram et al. ............... 438/612 |
| 6,211,092 B1 | * | 4/2001 | Tang et al. .................. 438/719 |
| 6,287,990 B1 | | 9/2001 | Cheung et al. ............. 438/780 |
| 6,451,683 B1 | | 9/2002 | Farrar ........................ 438/622 |
| 6,509,258 B2 | | 1/2003 | Farrar ........................ 438/622 |
| 6,514,667 B2 | | 2/2003 | Angelopoulos et al. .... 430/271.1 |
| 6,573,572 B2 | | 6/2003 | Farrar ........................ 257/386 |
| 2001/0046567 A1 | | 11/2001 | Matsuki et al. ............. 427/578 |
| 2003/0017642 A1 | | 1/2003 | Conti et al. ................... 438/99 |
| 2003/0024902 A1 | | 2/2003 | Li et al. ........................ 216/67 |

FOREIGN PATENT DOCUMENTS

| | | | |
|---|---|---|---|
| DE | 19804375 A1 | 1/1999 | ......... H01L/21/312 |
| EP | 0 519 079 A1 | 12/1992 | ......... H01L/21/312 |
| EP | 0 840 365 A2 | 5/1998 | ......... H01L/21/311 |
| EP | 0 849 789 A2 | 6/1998 | ......... H01L/21/768 |
| EP | 1 063 692 | 12/2000 | ......... H01L/21/316 |
| JP | 09-008031 | 1/1997 | ......... H01L/21/316 |
| JP | 09-237785 | 9/1997 | ......... H01L/21/316 |
| WO | 94/01885 | 1/1994 | ......... H01L/21/316 |
| WO | 98/08249 | 2/1998 | ......... H01L/21/312 |
| WO | 99/41423 | 8/1999 | |
| WO | 00/22671 | 4/2000 | ......... H01L/21/768 |

OTHER PUBLICATIONS

Matsuura, et al., "Novel Self–planarizing CVD Oxide for Interlayer Dielectric Applications," IEDM 1994 (1994) pp. 5.7.1.–5.7.4.

Gaillard, et al., "Silicon dioxide chemical vapor deposition using silane and hydrogen peroxide," *J. Vac. Sci. Technol.* (Jul./Aug. 1996) pp. 2767–2769.

Nara, et al., "Low Dielectric Constant Insulator Formed by Downstream Plasma CVD at Room Temperature Using TMS/O2",Japanese Journal of Applied Physics, vol. 36. No. 3B (Mar. 1997), pp. 1477–1480.

Grill, et al., "Low dielectric constant films prepared by plasma–enhanced chemical vapor deposition from tetramethylsilane", *J. of Applied Physics*, vol. 85. No. 6 (Mar. 1999), pp. 3314–3318.

Grill, et al., "Novel Low k Dielectrics based on Diamondlike Carbon Materials", J. Electrochem. Soc., 145(5) (May 1998), pp. 1649–1653.

Peters (ed.), "Pursuing the perfect Low–k Dielectric", Semiconductor International (Sep. 1999).

Zhao, et al., "Integration of Low Dielectric Constant Materials in Advanced Aluminum and Copper Interconnects", Mat. Res. Soc. Symp. Proc. vol. 564, 1999 Materials Research Society.

Tada, et al., "Correlations between Wetting and Structure in Methylsiloxane Layers on Oxides Formed by Chemical Vapor Surface Modification", J. Phys. Chem, vol. 98 (1994), pp. 12452–12457.

* cited by examiner

INTEGRATED LOW K DIELECTRICS AND ETCH STOPS

RELATED APPLICATIONS

This application is a continuation of U.S. patent application Ser. No. 09/329,012, filed on Jun. 9, 1999, now U.S. Pat. No. 6,340,435, which application is a continuation-in-part of U.S. patent application Ser. No. 09/021,788, which was filed on Feb. 11, 1998; now U.S. Pat. No. 6,054,379 a continuation-in-part of U.S. patent application No. 09/162,915, which was filed on Sep. 29, 1998 now U.S. Pat. No. 6,287,990; and a continuation-in-part of U.S. patent application Ser. No. 09/185,555, which was filed on Nov. 4, 1998 now U.S. Pat. No. 6,303,523.

BACKGROUND OF THE DISCLOSURE

1. Field of the Invention

The present invention relates to the fabrication of integrated circuits. More particularly, the invention relates to a process and apparatus for depositing and etching dielectric layers on a substrate.

2. Background of the Invention

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.35 $\mu$m and even 0.18 $\mu$m feature sizes, and tomorrow's plants soon will be producing devices having even smaller geometries.

In order to further reduce the size of devices on integrated circuits, it has become necessary to use conductive materials having low resistivity and insulators having low dielectric constants (k$\leq$4.0) to reduce the capacitive coupling between adjacent metal lines. A conductive material of interest is copper which can be deposited in submicron features by electrochemical deposition. Dielectric materials of interest are silicon oxides that contain carbon. Combination of silicon oxide materials and copper has led to new deposition methods for preparing vertical and horizontal interconnects since copper is not easily etched to form metal lines. Such methods include damascene or dual damascene methods depositing vertical and horizontal interconnects wherein one or more dielectric materials are deposited and etched to form the vertical and horizontal interconnects that are filled with the conductive material.

Dielectric layers can be deposited, etched and filled with metal in multiple steps that typically require frequent transfers of substrates between processing chambers dedicated to specific steps. Preferred methods for depositing dielectric layers include two predominant dual damascene methods where lines/trenches are filled concurrently with vias/contacts. In a "counter-bore" scheme, a series of dielectric layers are deposited on a substrate as described in more detail for various embodiments of the present invention. Then vertical interconnects such as vias/contacts are etched through all of the layers and horizontal interconnects such as lines/trenches are etched through the top layers. In the alternative, the lines/trenches are etched in the top layers and then the vias/contacts are etched through the bottom layers. A conductive material is then deposited in both the vertical and horizontal interconnects.

The other predominate scheme for creating a dual damascene structure is known as a "self-aligning contact" (SAC) scheme. The SAC scheme is similar to the counter-bore scheme, except that an etch stop layer is deposited on a bottom dielectric layer and etched to define the vias/contacts before another dielectric layer is deposited on top of the etch stop layer. The vertical and horizontal interconnects are then etched in a single step, and conductive material is then deposited in both the vertical and horizontal interconnects.

The counter-bore scheme does not require an etch stop layer between the dielectric layers if the upper dielectric layer can be etched using conditions that provide an etch rate for the upper layer that is at least about three times greater than the corresponding etch rate for the lower layer (i.e., an etch selectivity of at least about 3:1). However, the selectivity of etch processes for conventional low k dielectric layers is typically less than 3:1, and etch stop layers that provide the desired etch selectivity are routinely used between adjacent low k dielectric layers. The etch stop layers provide uniformity in the depth of horizontal interconnects across the surface of the substrate. The etch stop layers further reduce micro-trenching such that the bottom of horizontal interconnects are flat instead of deeper at outside edges. The etch stop layers further reduce faceting or fencing of previously etched vertical interconnects during etching of horizontal interconnects, wherein the edge between the bottom of the horizontal interconnects and the side walls of the vertical interconnects are sharp instead of either rounded (i.e., faceted) or raised (i.e., fenced) depending on whether the side walls of the vertical interconnects are exposed to etch gases or shielded from etch gases.

Conventional etch stop layers provide the benefits just described for damascene applications, but typically have dielectric constants that are substantially greater than 4. For example, silicon nitride has a dielectric constant of about 7, and deposition of such an etch stop layer on a low k dielectric layer results in a substantially increased dielectric constant for the combined layers. It has also been discovered that silicon nitride may significantly increase the capacitive coupling between interconnect lines, even when an otherwise low k dielectric material is used as the primary insulator. This may lead to crosstalk and/or resistance-capacitance (RC) delay that degrades the overall performance of the device.

Ideally, low k dielectric layers would be identified and etch processes would be defined wherein an etch selectivity for the dielectric layers is at least about 3:1 for use in selective etch processes such as dual damascene processes. Preferably, the low k dielectric layers that provide the desired etch selectivity could be deposited in the same chamber.

SUMMARY OF THE INVENTION

The present invention provides a method for etching one or more dielectric layers having a dielectric constant less than or equal to about 4.0 (low k), wherein differences in dielectric compositions provides an etch selectivity of at least 3:1. The invention includes etching of dielectric layers containing silicon, oxygen, carbon, and hydrogen wherein differences in composition provide an etch selectivity greater than 3:1 in the absence of a carbon:oxygen gas, such as carbon monoxide. Addition of carbon:oxygen gases to one or more fluorocarbon gases provides fast etch rates at lower etch selectivity which can be used when high selectivity is not needed. At least one of the dielectric layers preferably has high carbon content (greater than about 1% by atomic weight) or high hydrogen content (greater than about 0.1% by atomic weight). The carbon:oxygen gas is reduced or omitted from etch gases when a selective etching of adjacent dielectric layers is desired, such as when forming horizontal interconnects.

The present invention further provides an integrated method for depositing and etching adjacent low k dielectric materials with reduced transfers of a substrate between chambers, and with an etch selectivity between adjacent dielectric layers of at least 3:1. The high etch selectivity provides horizontal interconnects having uniform depths and substantially square corners without conventional etch stop layers. At least one dielectric layer contains silicon, oxygen, carbon, and hydrogen. Additional dielectric layers can be any dielectric layer having a dielectric constant less than about 4.0, such as produced by spin on deposition methods or by chemical vapor deposition methods. All dielectric layers are preferably produced by chemical vapor deposition of one or more organosilicon compounds using power levels, flow rates, and composition changes to control etch selectivity by controlling the silicon, oxygen, carbon, and hydrogen content of the deposited materials.

In a first preferred dual damascene embodiment, a first low k dielectric layer and a second low k dielectric layer are deposited on a substrate by oxidation of one or more organosilicon compounds, such as methylsilane, $CH_3SiH_3$, or hexamethyldisiloxane, $(CH_3)_3$—Si—O—Si—$(CH_3)_3$, for subsequent etching of vertical and horizontal interconnects. The first dielectric layer is an etch stop layer that contains silicon, oxygen, carbon, and hydrogen, preferably at least about 5% carbon by atomic weight and at least about 1% hydrogen by atomic weight. The second dielectric layer preferably contain less than two-thirds of the carbon or less than one-fifth of the hydrogen contained in the first dielectric layer, more preferably less than one-half of the carbon or less than one-tenth of the hydrogen. The vertical and horizontal interconnects are then etched into the low k dielectric layers using fluorocarbon gases. A carbon:oxygen compound, such as carbon monoxide, is added to the fluorocarbon gases during etching of vertical interconnects, and is not used during etching of horizontal interconnects to obtain an etch selectivity of at least 3:1. The horizontal and vertical interconnects can then be filled with a conductive material such as copper.

In a second preferred dual damascene embodiment, a first low k dielectric layer, a second low k dielectric layer, and a third low k dielectric layer are deposited on a substrate by oxidation of one or more organosilicon compounds, such as methylsilane, $CH_3SiH_3$, or trimethylsiloxane, $(CH_3)_3$—Si—O—Si—$(CH_3)_3$, for subsequent etching of vertical and horizontal interconnects. The second dielectric layer is an etch stop layer and contains silicon, oxygen, carbon, and hydrogen, preferably at least about 5% carbon by atomic weight and at least about 1% hydrogen by atomic weight. The first and third dielectric layers preferably contain less than two-thirds of the carbon and less than one-fifth of the hydrogen contained in the second dielectric layer, more preferably less than one-half of the carbon and less than one-tenth of the hydrogen. The vertical and horizontal interconnects are then etched into the low k dielectric layers using fluorocarbon gases. A carbon:oxygen compound, such as carbon monoxide, is added to the fluorocarbon gases during etching of vertical interconnects, and preferably is not used during etching of horizontal interconnects to obtain an etch selectivity of at least 3:1. The horizontal and vertical interconnects can then be filled with a conductive material such as copper.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1A:
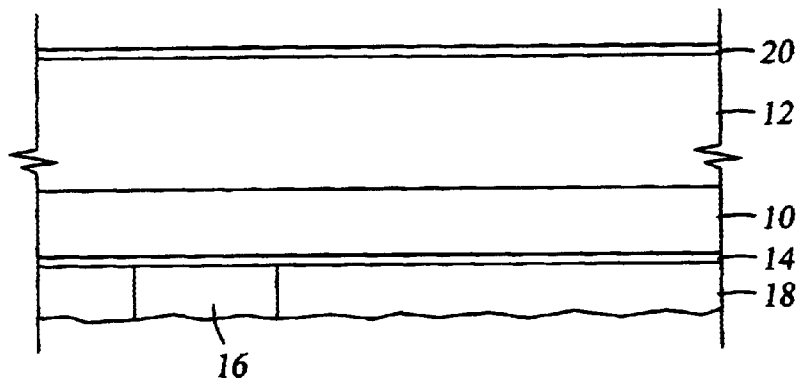
FIGS. 1A–1H are cross sectional views showing a first embodiment of a dual damascene deposition sequence of the present invention.

For a further understanding of the present invention, reference should be made to the ensuing detailed description.

DESCRIPTION OF PREFERRED EMBODIMENTS

The present invention provides a method for etching of low k dielectric layers (i.e., k less than or equal to about 4, preferably less than about 3). The invention includes etching one or more dielectric layers, wherein differences in dielectric compositions provides an etch selectivity of at least 3:1. The method is ideally suited for selective etch processes such as damascene schemes that deposit conductive materials, such as copper, within interconnects formed in the low k dielectric layers. In a preferred embodiment, the invention includes controlling combination of a carbon:oxygen gas with fluorocarbon etch gases to control etch selectivity for low k dielectric layers that contain hydrogen and carbon. The invention further provides control over the carbon and hydrogen content of adjacent dielectric layers to obtain low dielectric constants and an etch selectivity of at least 3:1 favoring one of the dielectric layers. Thus, the low k dielectric layers provide sufficient etch selectivity to exclude conventional etch stop materials having high dielectric constants, such as silicon nitride, from deposition and etch processes such as damascene schemes. Dielectric layers having low dielectric constants and low etch rates, in comparison to other dielectric layers using the same etch conditions as described herein, can replace or eliminate etch stop layers in many processes. The integrated deposition and etch methods of the invention also reduce transfers of a substrate between chambers by allowing all dielectric layers to be deposited in a single chamber prior to etching.

The method of the invention provides an integrated dual damascene process that includes depositing a first low k dielectric layer that contains silicon, carbon, oxygen, and hydrogen. A second low k dielectric layer deposited on the first low k dielectric layer preferably contains less than two-thirds of the carbon or less than one-fifth of the hydrogen contained in the first dielectric layer, more preferably less than one-half of the carbon and less than one-tenth of the hydrogen. Both dielectric layers can be etched, e.g., with a mixture of fluorocarbons and carbon:oxygen compounds such as carbon monoxide, to form vertical interconnects having steep sidewalls and sharp corners. The dielectric layer having the lower carbon or hydrogen content is selectively etched, such as by reducing or eliminating the flow of carbon:oxygen gas, to provide a selectivity of at least 3:1 favoring the dielectric layer having the lower carbon or hydrogen content.

A silicon oxide layer containing at least 1% by atomic weight of carbon or at least 0.1% by atomic weight of hydrogen is produced by spin on methods, or by chemical vapor deposition of one or more organosilicon compounds using power levels, flow rates, and composition changes to control the carbon content and hydrogen content of the deposited material. Low k dielectric layers having varying carbon or hydrogen content can be deposited in a single chamber to provide all of the dielectric layers in the dual damascene method. The deposited dielectric layers are then etched with gases that control passivating deposits on the surfaces of etched features to provide an etch selectivity of at least 3:1 between adjacent dielectric layers having dielectric constants less than about 4, preferably less than about 3.

The present invention broadly includes etching of adjacent low k dielectric layers. The scope of the invention as claimed below is fully supported by the description of the following preferred embodiments for etching or depositing dielectric layers that contain carbon or hydrogen.

A First Preferred Dual Damascene Process

A preferred dual damascene process shown in FIGS. 1A–1H includes etching of two adjacent low k dielectric layers 10, 12 wherein the etch selectivity between the two layers is at least 3:1 when the etch gases contain fluorocarbon gases and substantially no carbon:oxygen compounds. In other words, the adjacent low k dielectric layers have different compositions, and the second layer 12 has an etch rate that is at least three times greater than the etch rate of the first layer 10 when the etch gases include a fluorocarbon gas without substantial amounts of a carbon:oxygen gas. The first dielectric layer 10 functions as an etch stop layer during etching of the second dielectric layer 12. Addition of carbon:oxygen compounds such as carbon monoxide to the etch gases alters the etch rates for the dielectric layers 10, 12 such that both layers can be etched without substantial changes in the etch gas composition.

Referring to FIG. 1A, a first low k dielectric layer 10 containing silicon, oxygen, carbon, and hydrogen, such as spin on low k dielectrics (doped) or a CVD layer deposited by oxidation of an organosilicon compound containing C—H bonds and C—Si bonds, is deposited on a barrier layer 14. The first low k dielectric layer 10 preferably contains at least about 5% carbon by atomic weight or at least about 1% hydrogen by atomic weight. A second low k dielectric layer 12, such as spin on low k dielectrics (doped or undoped) or a CVD layer deposited by oxidation of an organosilicon compound contains less than about two-thirds of the carbon and less than about one-fifth of the hydrogen contained in the first dielectric layer 10, preferably less than one-half of the carbon and less than one-tenth of the hydrogen. The dielectric layers 10, 12 are typically deposited on a barrier layer 14, such as silicon nitride or silicon carbide, that protects the dielectric layers from diffusion of a conductive material 16 such as copper filling a feature in a prior dielectric layer 18. The etch selectivity between the first dielectric layer 10 and the barrier layer 14 is at least 2:1. A photoresist layer 20 or a hard mask layer is deposited on the stack of dielectric layers 10, 12 to transfer a pattern that is etched into the dielectric layers. The first dielectric layer 10 contains sufficient carbon or hydrogen to have an etch rate that is at least three times lower than the etch rate for the second dielectric layer 12 when etched with one or more fluorocarbon gases and substantially no carbon:oxygen gases.

Methods for depositing the first and second dielectric layers 10, 12 to obtain varying carbon and hydrogen contents is described in more detail below. Deposition of low k dielectric layers having low carbon content (less than about 1% by atomic weight) and low hydrogen content (less than about 0.1% by atomic weight) can also be performed using conventional processes for depositing silicon oxides, such as by oxidation of tetraethylorthosilicate (TEOS), also known as tetraethoxysilane.

The first dielectric layer 10 is preferably deposited to a thickness of about 5,000 to about 10,000 Å. The second dielectric layer 12 is then deposited to a thickness of about 5,000 to about 10,000 Å. The dielectric layers 10, 12 can be deposited in the same chamber using the same reactants, such as methysilane or trimethylsiloxane, by varying flow rates and or power levels as described in examples below. When the barrier layer 14 is a silicon carbide layer, the barrier layer may also be deposited in the same chamber as the dielectric layers using the same organosilicon compound.

Although the first dielectric layer could be etched prior to deposition of the second dielectric layer, it is preferred to deposit both dielectric layers prior to etching with gases that combine a fluorocarbon gas and a carbon:oxygen gas.

Figure 1B:
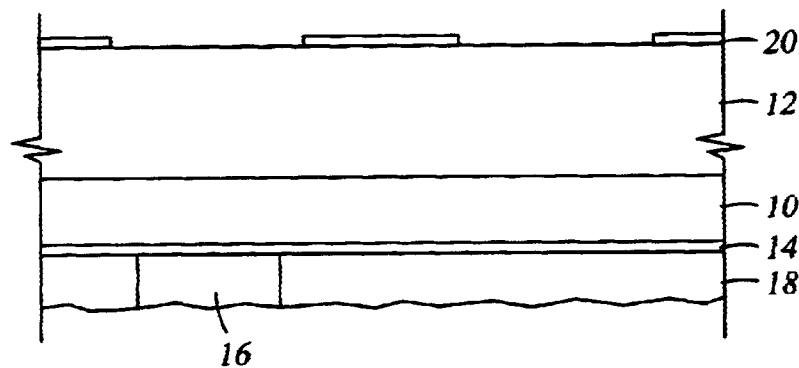

Referring to FIG. 1B, the photoresist or hard mask 20 is patterned to define horizontal interconnects to be etched in the second dielectric layer 12. As shown in an embodiment below, a pattern defining vertical interconnects could be used first. A typical photoresist for silicon oxide layers is "RISTON," manufactured by duPont de Nemours Chemical Company. The photoresist is exposed to UV light to define the pattern and then portions of the photoresist are stripped away. A hard mask such as a silicon oxide layer containing carbon or hydrogen could be used below the photoresist and etched as described below after the pattern is developed in the photoresist. The photoresist or hard mask then provides the pattern that is transferred to the underlying layers.

Figure 1C:
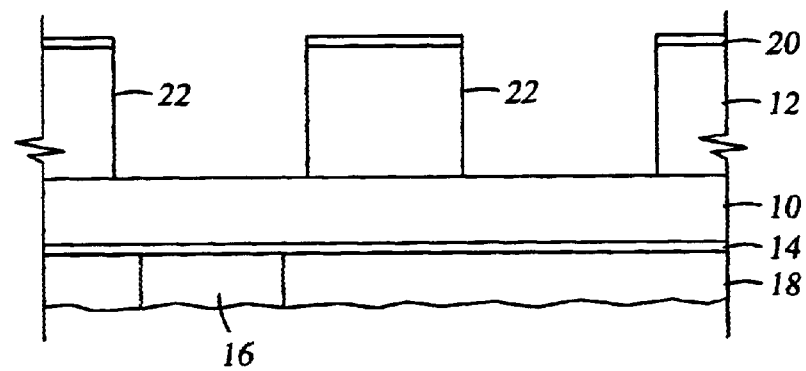

Referring to FIG. 1C, the horizontal interconnects 22 are then etched into the second dielectric layer 12 using gases that combine one or more fluorocarbons without substantial amounts of carbon:oxygen gases. Etching of the dielectric layers to form horizontal interconnects is preferably performed with a mixture of gases including argon and one or more gases selected from $CF_4$, $C_2F_6$, and $C_4F_8$. The photoresist 20 or other material used to pattern the horizontal interconnects 22 is then preferably stripped using an oxygen/hydrogen ashing process, e.g., by combination of oxygen and ammonia gases, or by another suitable process.

Figure 1D:
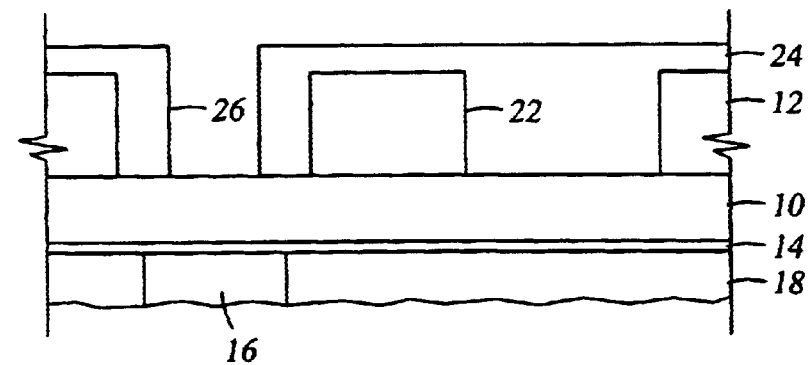

Referring to FIG. 1D, a second resist layer 24 or hard mask is deposited on the horizontal interconnects 22 and a planar surface is provided for transfer of a pattern that defines vertical interconnects 26. The photoresist is exposed to UV light to define the pattern and then portions of the photoresist are removed to define the vertical interconnects 26. The photoresist 24 or hard mask provides the pattern that is transferred to the underlying layers during subsequent etching. If the vertical interconnects are etched first as described in the next embodiment, then the second resist layer or hard mask would be used to define the horizontal interconnects.

Figure 1E:
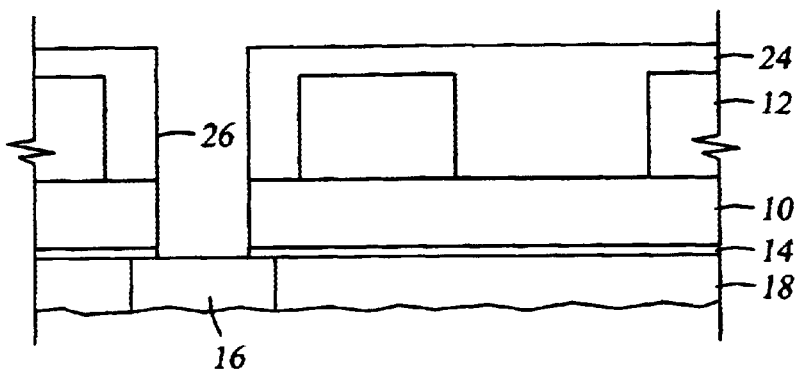
Figure 1F:
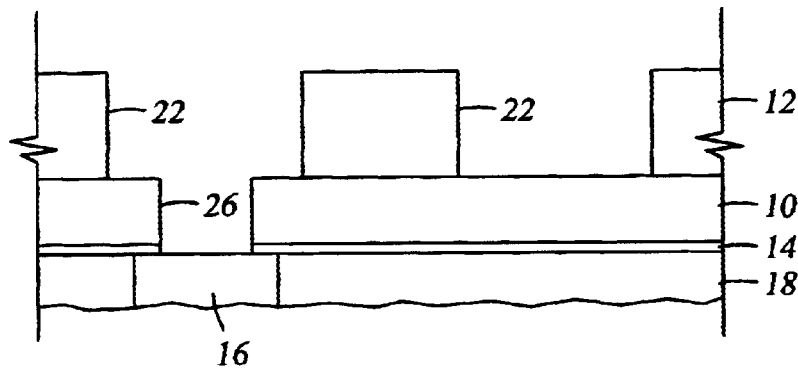

Referring to FIG. 1E, the first dielectric layer 10 and the barrier layer 14 are then etched to complete the vertical interconnects 26 using gases that combine one or more fluorocarbons and a carbon:oxygen gas. Etching of the dielectric layers to form vertical interconnects is preferably performed with a mixture of gases including argon, CO, and one or more gases selected from $CF_4$, $C_2F_6$, and $C_4F_8$. Referring to FIG. 1F, any photoresist or other material used to pattern the vertical interconnects 26 is preferably stripped using an oxygen/hydrogen ashing process, e.g., by combination of oxygen and ammonia gases, or by another suitable process.

Figure 1G:
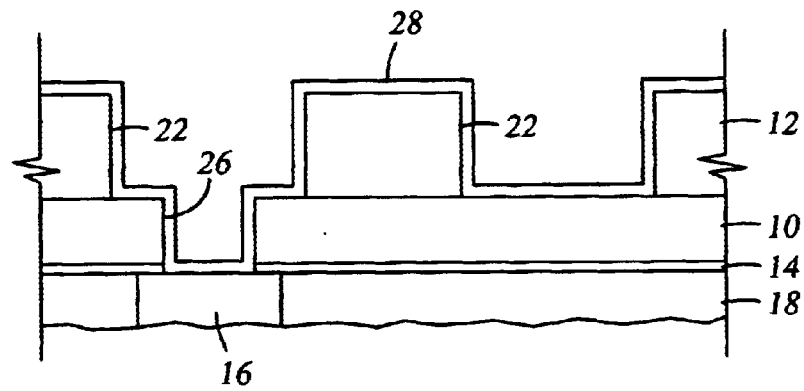
Figure 1H:
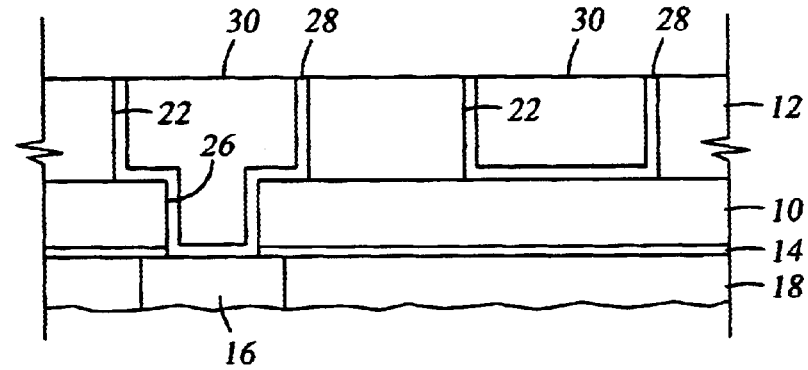

Referring to FIG. 1G, a suitable barrier layer 28 such as tantalum nitride is first deposited conformally in the horizontal and vertical interconnects 22, 26 to prevent metal migration into the surrounding silicon and/or dielectric materials. Referring to FIG. 1H, the horizontal and vertical interconnects 22, 26 are then filled with a conductive material 30 such as aluminum, copper, tungsten or combinations thereof. Presently, the trend is to use copper to form the smaller features due to the low resistivity of copper (1.7 mW-cm compared to 3.1 mW-cm for aluminum). Copper is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 1H.

In an alternative embodiment, the first dielectric layer 10 in FIGS. 1A–1H could be deposited on an initial silicon oxide layer (not shown), such as obtained by oxidation of TEOS, when the etch selectivity between the first dielectric layer 10 and the barrier layer 14 is less than 2:1, such as when the barrier layer 14 is silicon nitride and the dielectric layer contains more than 5% carbon by atomic weight or more than 1% hydrogen by atomic weight. The initial dielectric layer is selected to have an etch selectivity of at least 2:1 with respect to the barrier layer 14 so that the vertical interconnects 26 can be fully etched before the barrier layer is totally removed from some of the vertical interconnects. The initial oxide layer would preferably have a thickness of from about 1,000 Å to about 3,000 Å to provide time for the vertical interconnects to be completed to the barrier layer.

A Second Preferred Dual Damascene Process

Another preferred dual damascene process shown in FIGS. 2A–2H replaces a conventional etch stop layer with a low k dielectric layer that functions as an etch stop layer 40 between two low k dielectric layers 42, 44. The dielectric layers 42, 44 have an etch rate that is at least three times greater than the etch rate of the etch stop layer 40 when the etch gases contain fluorocarbon gases and substantially no carbon:oxygen compounds. Preferably, the dielectric layers and the etch stop layer have similar compositions except that the etch stop layer has higher amounts of carbon or hydrogen.

Figure 2A:
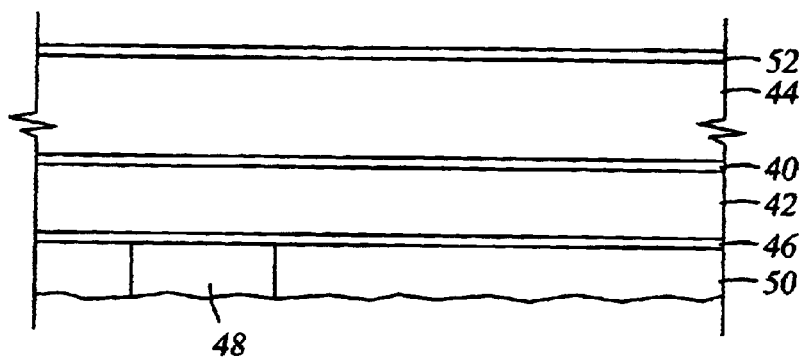
FIGS. 2A–2H are cross sectional views showing a second embodiment of a dual damascene deposition sequence of the present invention.

Referring to FIG. 2A, a first low k dielectric layer 42 and a third low k dielectric layer 44 contain low amounts of carbon and hydrogen, such as spin on low k dielectrics (doped or undoped) or a CVD layer deposited by oxidation of an organosilicon compound. A second low k dielectric layer 40, the etch stop layer, contains relatively high amounts of carbon or hydrogen, such as spin on low k dielectrics (doped) or a CVD layer deposited by oxidation of an organosilicon compound having C—H bonds and C—Si bonds. The second low k dielectric layer 40 preferably contains at least about 5% carbon by atomic weight or at least about 1% hydrogen by atomic weight. The first and third low k dielectric layers 42, 44 contain less than two-thirds of the carbon or less than one-fifth of the hydrogen contained in the second dielectric layer 40, preferably less than one-half of the carbon and less than one-tenth of the hydrogen. The dielectric layers 42, 40, 44 are typically deposited on a barrier layer 46, such as silicon nitride or silicon carbide, that protects a conductive material 48 such as copper filling a feature in a lower dielectric layer 50. The etch selectivity of the first dielectric layer 42 and the barrier layer 14 is at least 2:1.

A photoresist layer or a hard mask layer 52 is deposited on the stack of dielectric layers 40, 42, 44 to transfer a pattern that is etched into the dielectric layers. The etch stop layer 40 preferably contains sufficient carbon or hydrogen to have an etch rate that is at least three times lower than the etch rate for the first and third dielectric layers 42, 44 when the etch gases do not contain substantial amounts of a carbon:oxygen gas. Deposition of the dielectric layers to have varying carbon and hydrogen contents is described in more detail below.

The first and third dielectric layers 42, 44 are preferably deposited to a thickness of about 5,000 to about 10,000 Å. The etch stop layer 40 is preferably deposited to a thickness of about 500 to about 1,000 Å. The first and third dielectric layers 42, 44 and the etch stop layer 40 can be deposited in the same chamber using the same reactants by varying flow rates and or power levels as described in examples below. When the barrier layer 46 is a silicon carbide layer, the barrier layer may also be deposited in the same chamber as the dielectric layers.

Figure 2B:
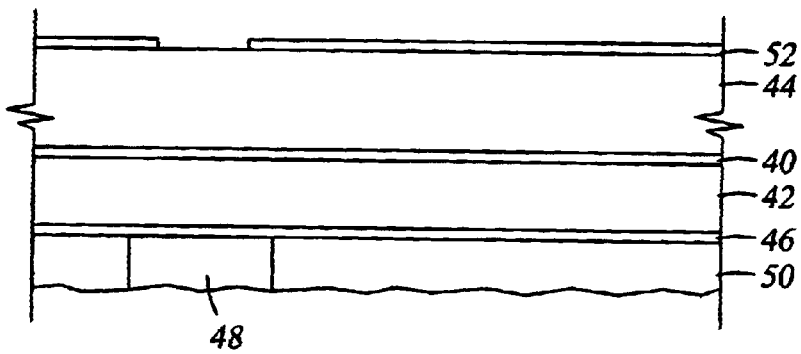

Referring to FIG. 2B, the photoresist 52 hard mask is then patterned to define vertical interconnects to be etched in the first and third low k dielectric layers 42, 44 and the etch stop layer 40. As shown in the first embodiment above, a pattern defining horizontal interconnects could be used first. A typical photoresist for silicon oxide layers is "RISTON," manufactured by duPont de Nemours Chemical Company. The photoresist is exposed to UV light to define the pattern and then portions of the photoresist are stripped away. A hard mask such as a silicon oxide layer containing carbon or hydrogen could be used below the photoresist and etched as described below after the pattern is developed in the photoresist. The photoresist or hard mask then provides the pattern that is transferred to the underlying layers.

Figure 2C:
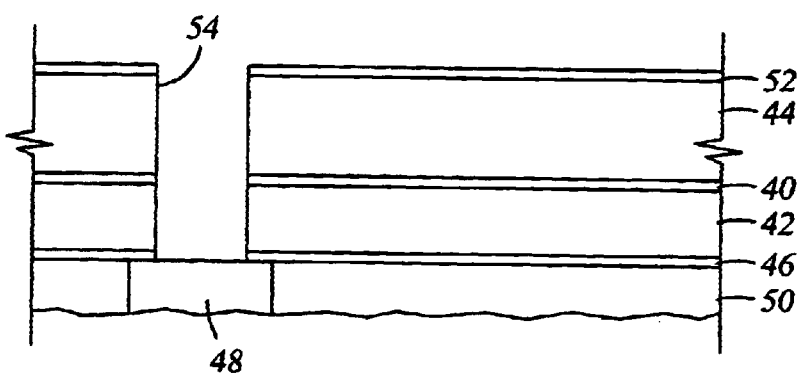

Referring to FIG. 2C, the vertical interconnects 54 are then etched into the first and third low k dielectric layers 42, 44, the low k etch stop layer 40, and the barrier layer 46 using gases that combine fluorocarbons and carbon:oxygen gases. Etching of the dielectric layers to form vertical interconnects is preferably performed with a mixture of gases including argon, CO, and one or more gases selected from $CF_4$, $C_2F_6$, and $C_4F_8$. Any photoresist 52 or other material used to pattern the vertical interconnects 54 is preferably stripped using an oxygen/hydrogen ashing process, e.g., by combination of oxygen and ammonia gases, or by another suitable process if necessary.

Figure 2D:
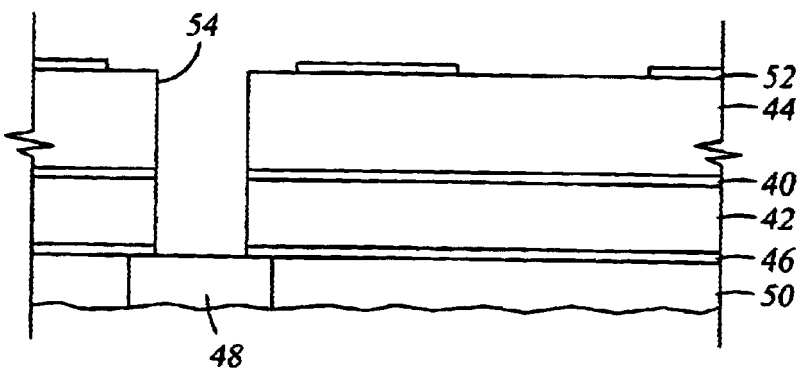

Referring to FIG. 2D, a second resist layer 55 or hard mask is deposited and then patterned to define the horizontal interconnects. The photoresist is exposed to UV light to define the pattern and then portions of the photoresist are removed to define the horizontal interconnects. If the horizontal interconnects were etched first, a second resist layer or hard mask would be used to define the vertical interconnects as previously described for the first embodiment. The photoresist could be left in the bottom of the vertical interconnects 54 if desired to reduce etching of the underlying layer 48.

Figure 2E:
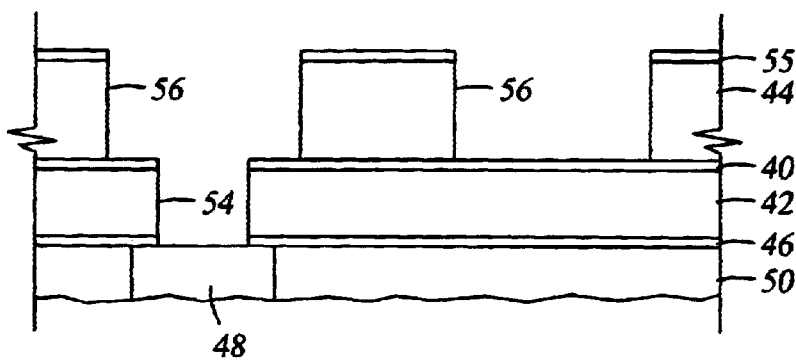
Figure 2F:
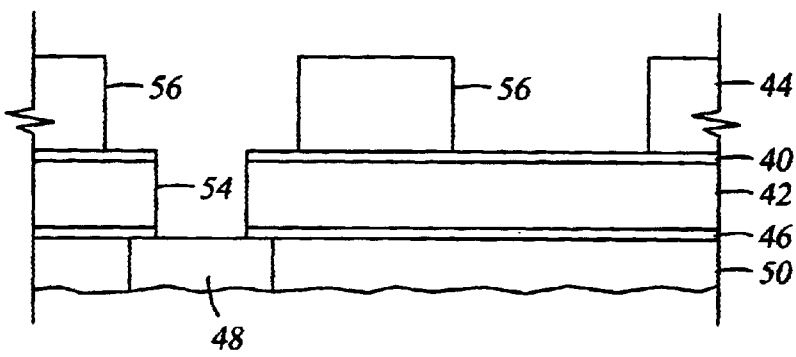

Referring to FIG. 2E, the third dielectric layer 44 is then etched to complete the horizontal interconnects 56 using gases that include one or more fluorocarbons without substantial amounts of the carbon:oxygen gases. Etching of the dielectric layers to form horizontal interconnects 56 is preferably performed with a mixture of gases selected from argon and one or more gases selected from $CF_4$, $C_2F_6$, and $C_4F_8$, to provide a selectivity of at least 3:1 with respect to the etch stop layer 40. The carbon:oxygen gas is reduced omitted to provide a lower etch rate for the etch stop layer 40. Referring to FIG. 2F, any photoresist or other material used to pattern the horizontal interconnects 56 is stripped prior to filling the horizontal and vertical interconnects 56, 54. The photoresist is preferably stripped using an oxygen/hydrogen ashing process, e.g., by combination of oxygen and ammonia gases, or by another suitable process.

Figure 2G:
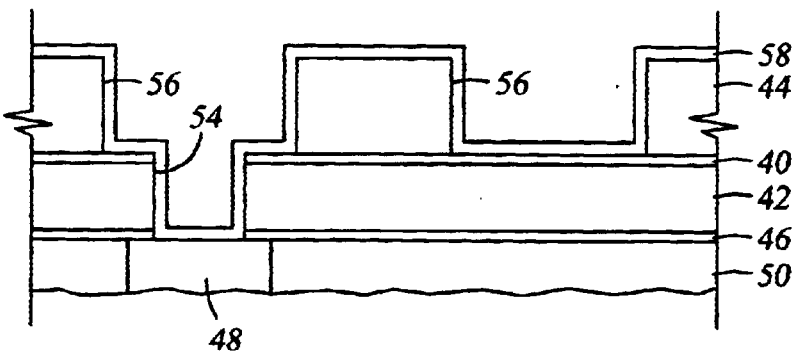
Figure 2H:
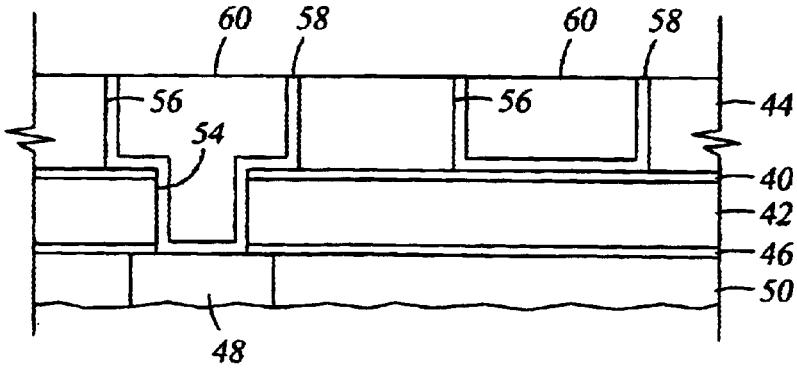

Referring to FIG. 2G, a suitable barrier layer 58 such as tantalum nitride is first deposited conformally in the horizontal and vertical interconnects 56, 54 to prevent metal migration into the surrounding silicon and/or dielectric materials. Referring to FIG. 2H, the horizontal and vertical interconnects 56, 54 are then filled with a conductive material 60 such as aluminum, copper, tungsten or combinations thereof as described for the first embodiment.

Depending on the selectivity of the etch processes, the horizontal or vertical interconnects can be etched after deposition of each dielectric layer. In the alternative, the etch stop layer could be etched prior to deposition of the third dielectric layer. However, additional transfers of the substrate between chambers is required to alternate between deposition and etching of the dielectric layers.

In an alternative embodiment, the etch stop 40 in FIGS. 2A–2H could be a silicon nitride or silicon carbide layer deposited on a conventional dielectric layer 42 having a dielectric constant greater than about 4.0. Thus, a low k dielectric layer 44 would enhance isolation of the horizontal interconnects 56 while the conventional dielectric layer 42 adequately isolates the vertical interconnects 54.

suitable for forming horizontal interconnects in dielectric layers. Such low k dielectric layers can be produced by spin on or CVD methods wherein silicon carbide layers or silicon oxide layers containing carbon and hydrogen are formed. Low k dielectric layers having varying etch rates can be produced in the same chamber by varying amounts of the process gases as discussed in the following description.

Preferred low k dielectric layers are produced by oxidation of an organosilicon compound containing both C—H bonds and C—Si bonds, such as methylsilane, $CH_3SiH_3$, dimethylsilane, $(CH_3)_2SiH_2$, trimethylsilane, $(CH_3)_3SiH$, 1,1,3,3-tetramethyldisiloxane, $(CH_3)_2$—SiH—O—SiH—$(CH_3)_2$, or trimethylsiloxane, $(CH_3)_3$—Si—O—Si—$(CH_3)_3$. The silicon oxide layers are cured at low pressure and high temperature to stabilize properties. The carbon and hydrogen contents of the deposited dielectric layers is controlled by varying process conditions such as by changing to another organosilicon compound, by oxidation with a variety of oxidizing gases such as oxygen, ozone, nitrous oxide, and water, by varying RF power levels during deposition, and by changing flow rates of process gases.

Carbon or hydrogen which remains in the silicon oxide or silicon carbide layers contributes to low dielectric constants, good barrier properties, and reduced etch rates. The silicon oxide or silicon carbide layers are produced from silicon compounds that include carbon within organic groups that are not readily removed by oxidation at processing conditions. Preferably C—H bonds are included, such as in alkyl or aryl groups. Suitable organic groups also can include alkenyl and cyclohexenyl groups and functional derivatives. The organosilicon compounds contain varying ratios of carbon to silicon and include:

| | |
|---|---|
| methylsilane, | $CH_3)_3$—$SiH_3$ |
| dimethylsilane, | $(CH_3)_2$—$SiH_2$ |
| trimethylsilane, | $(CH_3)_3$—SiH |
| tetramethylsilane, | $(CH_3)_4$—Si |
| dimethylsilanediol, | $(CH_3)_2$—Si—$(OH)_2$ |
| ethylsilane, | $CH_3$—$CH_2$—$SiH_3$ |
| phenylsilane, | $C_6H_5$—$SiH_3$ |
| diphenylsilane, | $(C_6H_5)_2$—$SiH_2$ |
| diphenylsilanediol, | $(C_6H_5)_2$—Si—$(OH)_3$ |
| methylphenylsilane, | $C_6H_5$—$SiH_2$—$CH_3$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | —(—$SiH_2CH_2$—$)_3$— (cyclic) |
| 1,3-dimethyldisiloxane, | $CH_3$—$SiH_2$—O—$SiH_2$—$CH_3$ |
| 1,1,3,3-tetramethyldisiloxane, | $(CH_3)_2$—SiH—O—SiH—$(CH_3)_2$ |
| hexamethyldisiloxane, | $(CH_3)_3$—Si—O—Si—$(CH_3)_3$ |
| 1,3-bis(silanomethylene)disiloxane, | $(SiH_3$—$CH_2$—$SiH_2$—$)_2$—O |
| bis(1-methyldisiloxanyl)methane, | $(CH_3$—$SiH_2$—O—$SiH_2$—$)_2$—$CH_2$ |
| 2,2-bis(1-methyldisiloxanyl)propane, | $(CH_3$—$SiH_2$—O—$SiH_2$—$)_2$—$C(CH_3)_2$ |
| 2,4,6,8-tetramethylcyclotetrasiloxane, | —(—$SiHCH_3$—O—$)_4$— (cyclic) |
| octamethylcyclotetrasiloxane, | —(—$Si(CH_3)_2$—O—$)_4$— (cyclic) |
| 2,4,6,8,10-pentamethylcyclopentasiloxane, | —(—$SiHCH_3$—O—$)_5$— (cyclic) |
| 1,3,5,7-tetrasilano-2,6-dioxy-4,8-dimethylene, | —(—$SiH_2$—$CH_2$—$SiH_2$—O—$)_2$— (cyclic) |
| 2,4,6-trisilanetetrahydropyran, and | —$SiH_2$—$CH_2$—$SiH_2$—$CH_2$—$SiH_2$—O— (cyclic) |
| 2,5-disilanetetrahydrofuran. | —$SiH_2$—$CH_2$—$CH_2$—$SiH_2$—O— (cyclic) |

Deposition of Low k Dielectric Layers

The present invention provides a dielectric layer having a low dielectric constant (k less than or equal to about 4.0) and having an etch rate at least 3 times lower than the etch rate for an adjacent low k dielectric layer under etch conditions and derivatives thereof.

The organo silicon compounds are preferably oxidized during deposition by reaction with oxygen ($O_2$) or oxygen containing compounds such as nitrous oxide ($N_2O$), ozone ($O_3$), carbon dioxide ($CO_2$), and water ($H_2O$), preferably $O_2$ or $N_2O$, such that the carbon content of the deposited layer is at least 1% by atomic weight and the hydrogen content of the deposited layer is at least 0.1% by atomic weight. The oxidized organosilicon layer preferably has a dielectric constant of about 3.0 or less. The oxidized organosilicon layers provide low etch rates in comparison to the conventional silicon oxide compounds.

The organosilicon compounds can also be deposited as silicon carbide layers by providing sufficient energy to dissociate the compounds. The silicon carbide layers may contain low amounts of oxygen to assist in varying etch rates for the deposited layers.

The hydrocarbon groups in the organosilanes and organosiloxane may be partially fluorinated to convert C—H bonds to C—F bonds. Many of the preferred organosilane and organosiloxane compounds are commercially available. A combination of two or more of the organosilanes or organosiloxanes can be employed to provide a blend of desired properties such as dielectric constant, oxide content, hydrophobicity, film stress, and plasma etching characteristics.

Oxygen and oxygen containing compounds are preferably dissociated to increase reactivity when necessary to achieve a desired carbon content in the deposited layer. RF power can be coupled to the deposition chamber to increase dissociation of the oxidizing compounds. Reduced amounts of oxygen or reduced dissociation of the oxygen results in higher carbon contents, especially higher amounts of C—H or Si—$CH_3$ bonds in comparison to Si—O bonds. The oxidizing compounds may also be dissociated in a microwave chamber prior to entering the deposition chamber to reduce excessive dissociation of the silicon containing compounds. Deposition of the silicon oxide layer can be continuous or discontinuous. Although deposition preferably occurs in a single deposition chamber, the layer can be deposited sequentially in two or more deposition chambers. Furthermore, RF power can be cycled or pulsed to reduce heating of the substrate and promote greater porosity in the deposited layer. During deposition of the silicon oxide layer, the substrate is maintained at a temperature of from about −20° C. to about 400° C., and preferably is maintained at a temperature of approximately −20° C. to 40° C.

The oxidized organosilicon compounds adhere to contacted surfaces such as a patterned layer of a semiconductor substrate to form a deposited layer. The deposited layers are cured at low pressure and at temperatures from about 100 to about 450° C., preferably above about 400° C. to stabilize the barrier properties of the layers. The deposited layer has sufficient hydrogen content to provide barrier properties. The carbon content preferably includes C—H or C—F bonds to provide a hydrophobic layer that is an excellent moisture barrier.

The method of the present invention employs a substrate processing system having a vessel including a reaction zone, a cathode pedestal for positioning a substrate in the reaction zone, and a vacuum system. The processing system further comprises a gas/liquid distribution system connecting the reaction zone of the vessel to supplies of an organosilane or organosiloxane compound, an oxidizing gas, and an inert gas, and an RF generator coupled to the gas distribution system for generating a plasma in the reaction zone. The processing system further comprises a controller comprising a computer for controlling the vessel, the gas distribution system, and the RF generator, and a memory coupled to the controller, the memory comprising a computer usable medium comprising a computer readable program code for selecting the process steps of depositing a low dielectric constant layer with a plasma of an organosilane or organosiloxane compound and an oxidizing gas.

Etching of the deposited silicon oxide layers can be performed in conventional etch chambers such as described in U.S. Pat. No. 5,843,847, which description is incorporated by reference herein. A preferred etch chamber is the IPS chamber available from Applied Materials, Inc. of Santa Clara, Calif. The '847 patent further describes etching of dielectric layers, which description is also incorporated by reference herein.

Further description of the invention relates to specific apparatus for depositing and etching silicon oxide layers of the present invention and to preferred deposition and etch sequences for preparing dual damascene silicon oxide layers.

Exemplary CVD Plasma Reactor and Process

Figure 3:
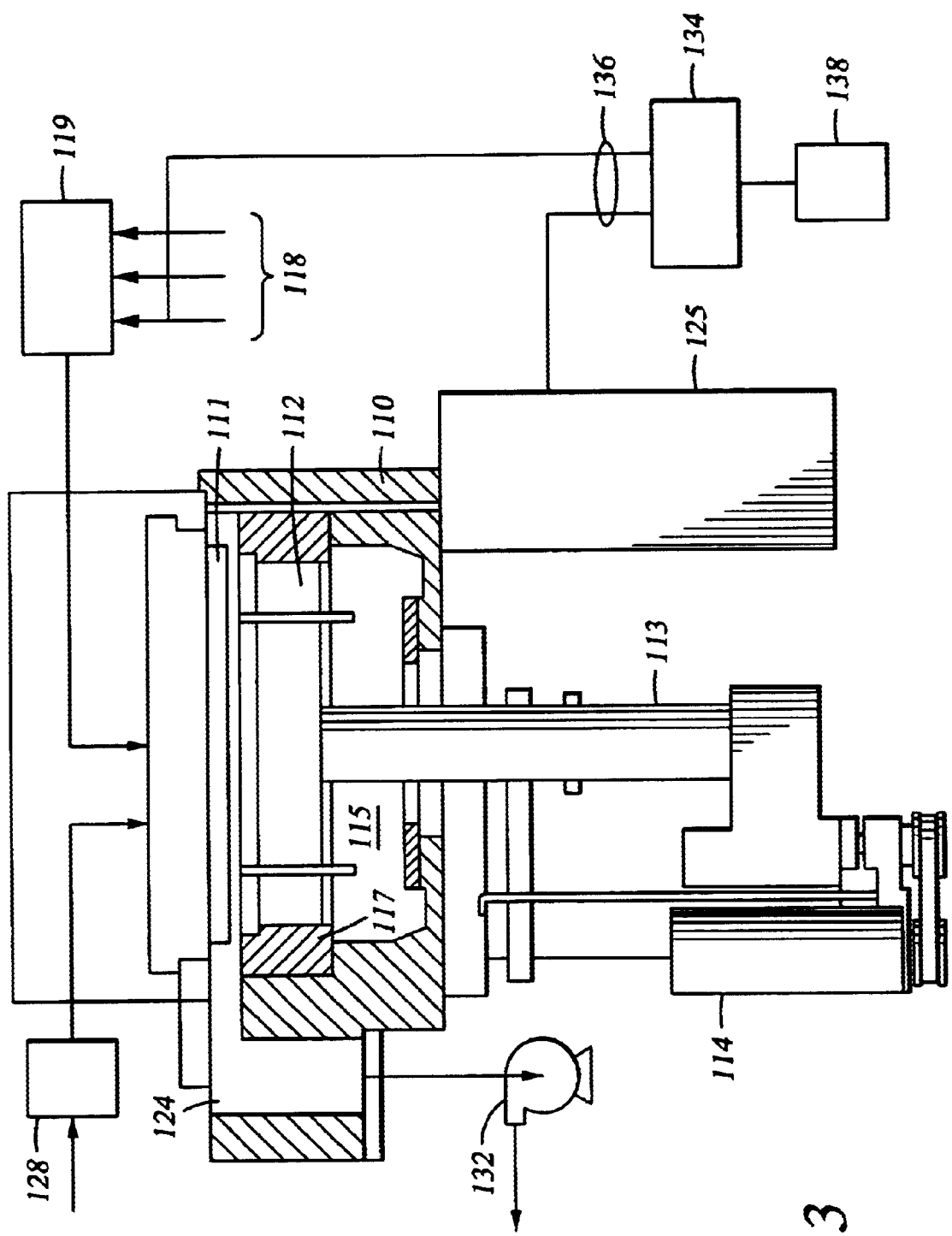
FIG. 3 is a cross-sectional diagram of an exemplary CVD plasma reactor configured for use according to the present invention.

One suitable CVD plasma reactor in which a method of the present invention can be carried out is shown in FIG. 3, which is a vertical, cross-section view of a parallel plate chemical vapor deposition reactor 110 having a high vacuum region 115. Reactor 110 contains a gas distribution manifold 111 for dispersing process gases through perforated holes in the manifold to a substrate or wafer (not shown) that rests on a substrate support plate or susceptor 112 which is raised or lowered by a lift motor 114. A liquid injection system (not shown), such as typically used for liquid injection of TEOS, may also be provided for injecting a liquid organosilane and/or organosiloxane compound. The preferred organosilanes are gases.

The reactor 110 includes heating of the process gases and substrate, such as by resistive heating coils (not shown) or external lamps (not shown). Referring to FIG. 3, susceptor 112 is mounted on a support stem 113 so that susceptor 112 (and the wafer supported on the upper surface of susceptor 112) can be controllably moved between a lower loading/off-loading position and an upper processing position which is closely adjacent to manifold 111.

When susceptor 112 and the wafer are in processing position 114, they are surrounded by a an insulator 117 and process gases exhaust into a manifold 124. During processing, gases inlet to manifold 111 are uniformly distributed radially across the surface of the wafer. A vacuum pump 132 having a throttle valve controls the exhaust rate of gases from the chamber.

Before reaching manifold 111, deposition and carrier gases are input through gas lines 118 into a mixing system 119 where they are combined and then sent to manifold 111. An optional microwave applicator 128 can be located on the input gas line for the oxidizing gas to provide additional energy that dissociates only the oxidizing gas. The microwave applicator provides from 0 to 6000 W. Generally, the process gases supply line 118 for each of the process gases also includes (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in reactor 110 can be either a thermal process or a plasma enhanced process. In a plasma process, a controlled plasma is typically formed adjacent to the wafer by RF energy applied to distribution manifold 111 from RF power supply 125 (with susceptor 112 grounded). Alternatively, RF power can be provided to the susceptor 112 or RF power can be provided to different components at different frequencies. RF power supply 125 can supply either single or mixed frequency RF power to enhance the decomposition of reactive species introduced into the high vacuum region 115. A mixed frequency RF power supply typically supplies power at a high RF frequency (RF1) of 13.56 MHz to the distribution manifold 111 and at a low RF frequency (RF2) of 360 KHz to the susceptor 112. The silicon oxide layers of the present invention are most preferably produced using low levels of constant high frequency RF power or pulsed levels of high frequency RF power. Pulsed RF power preferably provides 13.56 MHz RF power at about 20 W to about 500 W, most preferably from 20 W to about 250 W, during about 10% to about 30% of the duty cycle. Constant RF power preferably provides 13.56 MHz RF power at about 10 W to about 200 W, preferably from about 20 W to about 100 W. Low power deposition preferably occurs at a temperature range from about −20° C. to about 40° C. At the preferred temperature range, the deposited layer is partially polymerized during deposition and polymerization is completed during subsequent curing of the layer.

For deposition of silicon carbide layers, the reaction occurs without a substantial source of oxygen introduced into the reaction zone. Preferably, the 13.56 MHz RF power source applies about 300 to 700 watts with a power density of about 4.3 to 10 watts/cm$^2$ to the anode and cathode to form the plasma in the chamber with the organosilicon compound. The substrate surface temperature is maintained between about 200° to 400° C., during the deposition of the SiC. For a more optimal, designated "most preferred," process regime, trimethylsilane or methylsilane flow rate is about 50 to 200 sccm, helium or argon flow rate to about 200 to 1000 sccm, the chamber pressure is from about 6 to about 10 Torr, the RF power is from about 400 to about 600 watts with a power density of about 5.7 to 8.6 watts/cm$^2$, and the substrate surface temperature maintained between about 300° to 400° C.

Typically, any or all of the chamber lining, distribution manifold 111, susceptor 112, and various other reactor hardware is made out of material such as aluminum or anodized aluminum. An example of such a CVD reactor is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

The lift motor 114 raises and lowers susceptor 112 between a processing position and a lower, wafer-loading position. The motor, the gas mixing system 119, and the RF power supply 125 are controlled by a system controller 134 over control lines 136. The reactor includes analog assemblies, such as mass flow controllers (MFCs) and standard or pulsed RF generators, that are controlled by the system controller 134 which executes system control software stored in a memory 138, which in the preferred embodiment is a hard disk drive. Motors and optical sensors are used to move and determine the position of movable mechanical assemblies such as the throttle valve of the vacuum pump 132 and motor for positioning the susceptor 112.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the wafer could be supported and heated by a resistively heated susceptor. The pretreatment and method for forming a pretreated layer of the present invention is not limited to any specific apparatus or to any specific plasma excitation method.

Figure 4:
FIG. 4 show the relative amounts of carbon and hydrogen in four low k dielectric compositions that contain silicon, oxygen, carbon, and hydrogen.

The etch rate of low k dielectrics deposited in the processing chamber is controlled by adjusting the process gas flow rates and reactor power levels to deposit dielectric layers having desired carbon and hydrogen contents. The relative ratios of Si—CH$_3$, Si—H, or C—H bonds to the number of Si—O bonds for preferred dielectric layers A–D described in Table 1 are shown in FIG. 4. Based on atomic analysis of layer D, the estimated hydrogen and carbon contents of layers A–D are shown in Table 1 as atomic weight percent. In FIG. 4, A–C represent methylsilane flow rates of 34 sccm and D is a flow rate of 68 sccm. A and D are at power levels of 80 W, B is a power level of 300 W, and C is a power level of 20 W. The remaining conditions for depositing layers A–D are shown in Table 1. Table 1 and FIG. 4 demonstrate the variability in the hydrogen and carbon content based on changes in process conditions, which is an aspect of the present invention. The variation in carbon or hydrogen content is then used to provide selective etching of the layer having lower carbon content or lower hydrogen content as discussed in more detail below.

TABLE 1

Process Conditions for Varying Carbon and Hydrogen Contents

| Recipe | A | B | C | D |
|---|---|---|---|---|
| Methysilane (sccm) | 34 | 34 | 34 | 68 |
| N$_2$O (sccm) | 360 | 360 | 360 | 360 |
| He (sccm) | 2000 | 2000 | 2000 | 2000 |
| Power (W) | 80 | 300 | 20 | 80. |
| Spacing (mils) | 320 | 320 | 320 | 320 |
| Pressure (torr) | 3.0 | 3.0 | 3.0 | 3.0 |
| Est. C, atomic wt % | 8 | 5 | 9.5 | 10.5 |
| Est. H$_2$, atomic wt % | 5 | 0.3 | 2.5 | 3 |

Exemplary Etch Processes and Chamber

A preferred etch process for dielectric layers is described in U.S. Pat. No. 5,843,847, issued Dec. 1, 1998, which description is incorporated by reference herein. In the preferred process, etching of sidewalls in vertical and horizontal interconnects is controlled by formation of passivating deposits that condense on the sidewalls and reduce etching of the sidewalls. The etch gases include fluorocarbon gases and carbon-oxygen gases combined in amounts that provide either high selectivity or low selectivity depending on the amount of the carbon:oxygen gas. The etch compositions also provide low microloading which is a measure of the difference in etch rate for large and small sized features.

In order to provide highly selective etching and reduced microloading for silicon oxide layers that contain hydrogen and carbon, it was discovered that the carbon:oxygen gases actually assisted in removing excessive passivating compounds that built up on the surfaces of etched features from the carbon or the hydrogen released from the dielectric layer. The excessive passivating layer on the surfaces of the etched features limits etching of the sidewalls when carbon:oxygen gases are included in the etch gases, and reduction of the passivating layer surprisingly occurs by lowering or stopping the flow of the carbon:oxygen gas.

Figure 5:
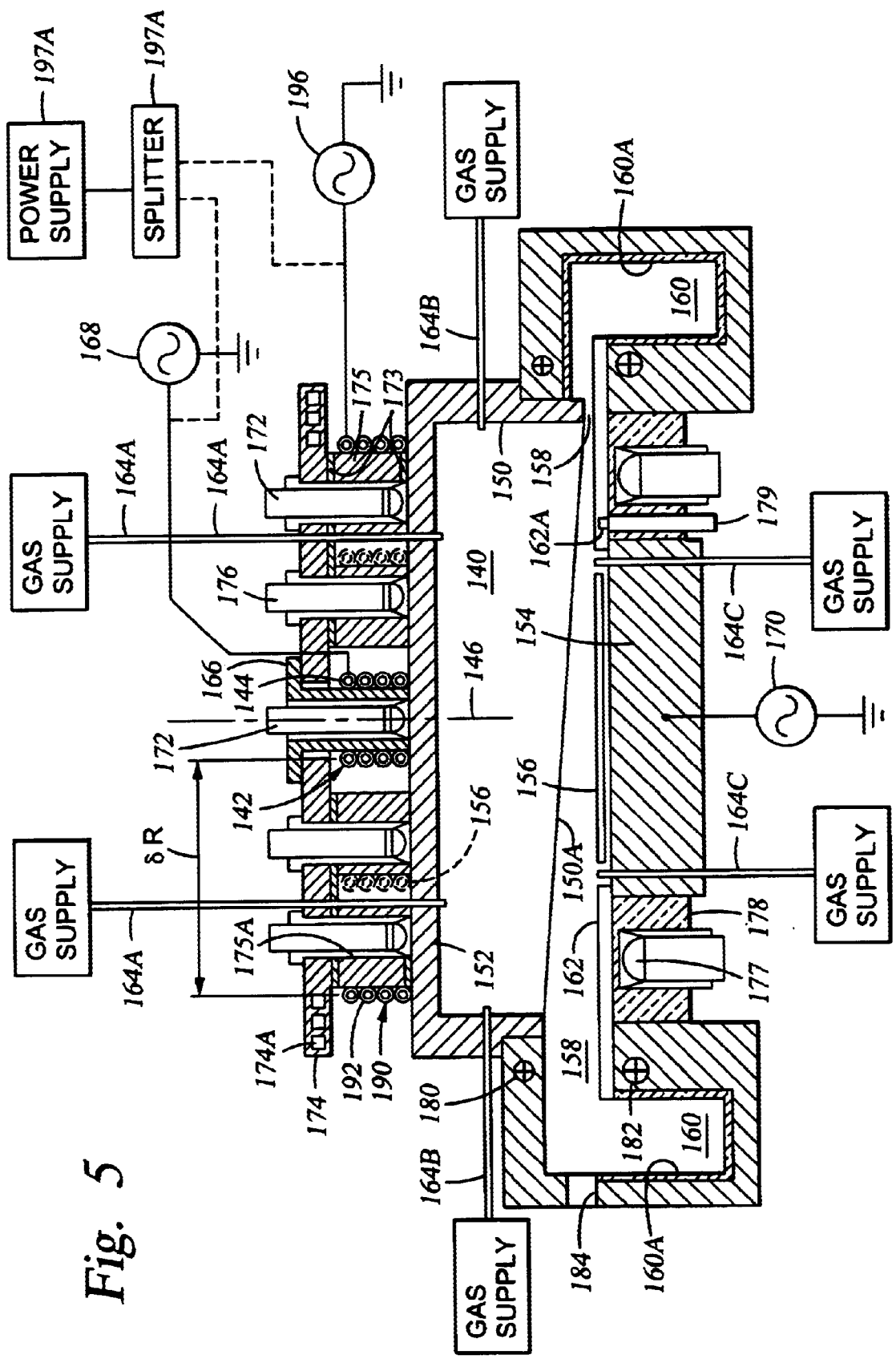
FIG. 5 is a schematic view in vertical cross-section of an etch process chamber suitable for practicing the etching process of the present invention.

FIG. 5 illustrates an inductively coupled RF plasma etch chamber having a single wafer processing chamber 140, such as for example, an IPS ETCH chamber, commercially available from Applied Materials Inc., Santa Clara, Calif. The particular embodiment of the etch chamber shown herein is provided only to illustrate the invention, and should not be used to limit the scope of the invention. Other inductively coupled chambers can be used to etch the dielectric layers, such as a Dielectric Etch MxP+ chamber, also commercially available from Applied Materials. The dielectric layers can also be etched in parallel plate plasma chambers.

The etch chamber shown in FIG. 5 is typically evacuated to a pressure of less than about 150 mTorr, and a substrate is transferred to the processing chamber 140. A plasma is generated in the processing chamber by dual solenoid coils 142, 190 having windings 144, 192 that are concentrated in a non-planar fashion around an axis of symmetry 146 that coincides with the center of the processing chamber 140. Other coil configurations, such as an optional coil 194, would be evident to persons skilled in the art.

The processing chamber 140 is surrounded by a cylindrical side wall 150 and a ceiling 152. A pedestal 154 at the bottom of the processing region 140 supports the substrate 156. The processing chamber 140 is evacuated through an annular passage 158 to a pumping annulus 160 surrounding the lower portion of the processing chamber 140. The interior of the annulus 160 is preferably lined with a replaceable liner 160A. The annular passage 158 is defined by the bottom edge 150A of the side wall 150 and a disposable ring 162 that surrounds the pedestal 154. Process gas is provided through one or more gas feeds 164A–C.

The central solenoid coil 142 is wound around a housing 166 surrounding a center radiant heater 172. A first plasma source RF power supply 168 is connected to the inner coil 142 and a second power supply 196 is connected to the outer coil 190. In the alternative, a single power supply 197A could be connected to both coils using a splitter 196. A bias power supply 170 is connected to the pedestal 154. Additional radiant heaters 172 such as halogen lamps are mounted in unoccupied regions of the ceiling and a cooling plate 174 having coolant passages 174A rests above the ceiling. A torus 175 holds the cooling plate 174 above the chamber ceiling 152. Plural axial holes 175A extend through the torus 175 for mounting the heaters or lamps 172. The ceiling temperature is sensed by a thermocouple 176. For good thermal contact, a thermally conductive material 173 is placed between the torus 175 and the chamber ceiling 152, and between the torus 175 and the cold plate 174.

Radiant heaters 177 such as tungsten halogen lamps are positioned below the disposable ring 162 to heat the ring through a window 178. The temperature of the ring 162 is controlled using a temperature sensor 179 that may extend into a hole 162A in the ring 162.

Plasma confinement magnets 180, 182 are provided adjacent to the annular opening 158 to prevent or reduce plasma flow into the pumping annulus 160. The replaceable liner 160A is preferably cooled to a temperature that collects any active monomer or specie that enters the annulus 160. A wafer slit 184 in a wall of the pumping annulus 160 accommodates wafer ingress and egress.

The etching process of the present invention provides high etch rates and highly selective etching of the dielectric layers on the substrate. The process gas used in the etching process comprises (i) fluorocarbon gas for etching the dielectric layer and forming passivating deposits on the substrate, (ii) carbon-oxygen gas for reducing formation of passivating deposits, and (iii) argon or nitrogen-containing gas for removing the passivating deposits on the substrate. The nature of these gases and preferred volumetric flow ratios of the gases will now be described.

The fluorocarbon gas is capable of forming fluorine-containing species that etch the dielectric layer on the substrate. For example, a silicon dioxide layer is etched by fluorine containing ions and neutrals to form volatile $SiF_x$ species that are exhausted from the processing chamber 140. Suitable fluorocarbon gases include carbon, fluorine, and optionally hydrogen, such as for example, $CF_4$, $CH_3F$, $CHF_3$, $CH_2F_2$, $C_2F_6$, $C_3F_8$, $C_4F_8$, $C_2HF_5$, and $C_4F_{10}$. It is believed, in general, the absence of hydrogen in the process gas provides increased amounts of free carbon and $CF_2$ radicals that result in anisotropic etching and increased etching selectivity. Preferred gases include $CF_4$, $C_2F_6$, and $C_4F_8$.

The carbon:oxygen gas is used to provide etch selectivity when desired by controlling formation and removal of carbon-containing species that form passivating deposits on the substrate. In addition, the carbon:oxygen gas enhances the formation of free oxygen species that react with other species to reduce the formation of polymers that deposit on the surfaces of the etched features as passivating deposits. For example, $CF_2$ radicals polymerize to form polymers that deposits on the sidewalls of the freshly etched features as a passivating deposit that improves vertical anisotropic etching. For these reasons, the flow rate of carbon-oxygen gas is substantially reduced or eliminated to provide sufficient fluorine-containing species to rapidly etch the dielectric layers while providing high dielectric to underlayer etching selectivity, and anisotropic etching. Suitable carbon:oxygen gases include for example, CO, HCOOH, HCHO, and $CO_2$ of which CO is preferred. Oxygen may also be added to assist in removing excessive passivating deposits that form on the sidewalls of vias and trenches.

It is believed the oxygen containing gases react with some of the $CF_2$ radicals to form volatile radicals which are exhausted from the processing chamber 140. A resultant increase in oxygen species at the surface of the specie or in the plasma zone reacts with free carbon to reduce the amount of passivating deposits formed on the substrate, and prevent deposition of excessively thick passivating deposit layers that can stop the etching process.

For selective etching, the volumetric flow ratio of fluorocarbon/carbon:oxygen gases is selected so the rate of formation of passivating deposits on the surfaces of the freshly etched features is different for the different low k dielectric materials. For the dielectric material having the faster etch rate, the rate of formation of passivating deposits is approximately equal to the rate of removal of the passivating deposits. For the low dielectric material having the slower etch rate, the rate of formation of passivating deposits exceeds the rate of removal of the passivating deposits. This provides high etching selectivity ratios, for example, an etching selectivity ratio of at least about 3:1, while simultaneously etching the dielectric layer at a high etch rate of at least about 400 nm/min, and more typically from 600 to 900 nm/min, with reduced etch rate microloading. When the substrate comprises an underlayer of material below the dielectric layer, such as silicon nitride or silicon carbide, the volumetric flow ratio of fluorocarbon/carbon:oxygen gas can be tailored to increase etching selectivity ratios for specific combinations of materials, such as for example, the etching selectivity of etching dielectric to resist, diffusion barrier layers, or anti-reflective layers. The volumetric flow ratio of fluorocarbon/carbon:oxygen containing gas can also be adjusted so that the sidewalls of the etched features have smooth surfaces that form angles of at least about 87 degrees with the surface of the dielectric layer on the substrate. The volumetric flow ratios can be tailored for different combinations of materials, and feature geometry, such as feature aspect ratios, to achieve specific etching selectivities, etch rate microloading, or etch rates without deviating from the scope of the present invention.

Preferably, inert gas is added to the process gas to form ionized sputtering species that sputter-off the passivating deposits on the sidewalls of the freshly etched features. The inert gas also ionizes to form ionized metastable states that enhance dissociation of the process gas. Thus, it is also desirable for the inert gas to have a wide range of excitation energies, so that energy transfer reactions which promote dissociation of the process gas can occur between the excited inert gas and the process gas. Suitable inert gases include argon, helium, neon, xenon, and krypton, of which argon is preferred. Sufficient inert gas is added to the process gas to assist in sputtering the passivating deposits off the substrate, and to enhance disassociation of the process gas. However, excessive flow of inert gas causes excessive sputtering of the resist on the substrate, resulting in resist faceting, etching of the dielectric layer underlying the resist, and high profile microloading.

Preferred compositions of process gases, suitable for etching carbon containing silicon oxide layers, comprise a mixture of gases including argon, CO, and one or more gases selected from $CF_4$, $C_2F_6$, and $C_4F_8$. For the volume of the processing chamber described herein, (i) a suitable flow rate of $CF_4$ is from about 0 to about 80 sccm, and more preferably from about 20 to about 60 sccm; (ii) a suitable flow rate of $C_4F_8$ is from about 0 to about 40 sccm, and more preferably from about 5 to about 30 sccm; (iii) a suitable flow rate of CO is from about 0 to about 200 sccm, and more preferably from about 20 to about 150 sccm; and (iv) a suitable flow rate of argon is from about 50 to about 400 sccm, and more preferably from about 100 to about 300 sccm. Because actual flow rates are dependent upon the volume of the chamber 140, the invention should not be limited to the flow rates recited herein.

For etching of vertical interconnects in the preferred dielectric layers on an 8 inch substrate, the etch gases preferably comprise from about 10 sccm to about 80 sccm of one or more fluorocarbon gases and from about 100 sccm to about 200 sccm of a carbon:oxygen gas. During etching of the vertical interconnects, a mixture of fluorocarbon gases is preferred so that passivating deposits can be controlled by varying the relative amounts of specific fluorocarbon gases in addition to varying the relative amounts of the fluorocarbon gases and carbon:oxygen gases. A preferred carrier gas is from about 100 sccm to about 300 sccm of argon.

For etching of horizontal interconnects in the preferred dielectric layers on an 8 inch substrate, the etch gases preferably comprise from about 5 sccm to about 80 sccm of one or more fluorocarbon gases and less than about 5 sccm of a carbon:oxygen gas. During etching of the horizontal interconnects, a mixture of fluorocarbon gases can also be used to control passivating although passivating deposits are readily controlled by adjusting the flowrate of the fluorocarbon gases. A preferred carrier gas is from about 100 sccm to about 300 sccm of argon.

The etching process of the present invention provides non-selective or selective etching of dielectric layers containing carbon without sacrificing etch rate microloading and dielectric etching rates. By etching selectivity ratio, it is meant the ratio of the rate of etching of the dielectric layer to the rate of etching of adjacent layers of other materials, that include the underlying anti-reflective, diffusion barrier, silicon nitride, or silicon carbide, and overlying resist layers. The combination of the high etch rates, low microloading, and high etching selectivity is obtained by balancing the rate of deposition and removal of passivation species from the substrate, and by controlling the amount of fluorine-containing species available for etching the dielectric layer. While excessive passivating deposits reduce overall dielectric etch rates and increase etch rate microloading, suppression of the deposition or formation of polymer typically reduces etching selectivity.

The invention is further described by the following examples which are not intended to limit the scope of the claimed invention.

EXAMPLE 1

A first oxidized methylsilane layer is deposited on an 8 inch silicon substrate placed in a DxZ chamber, available from Applied Materials, Inc., at a chamber pressure of 3.0 Torr and temperature of 15° C. from reactive gases which are flowed into the reactor as follows:

| | |
|---|---|
| Methylsilane, $CH_3$—$SiH_3$, at | 34 sccm |
| Nitrous oxide, $N_2O$, at | 360 sccm |
| Helium, He, at | 2000 sccm. |

The substrate is positioned 320 mil from the gas distribution showerhead and 300 W of high frequency RF power (13 MHz) is applied to the showerhead for plasma enhanced deposition of a first oxidized methylsilane layer containing about 5% carbon by atomic weight and about 0.3% hydrogen by atomic weight, the first layer having a thickness of at least 5,000 Å. Then the flow of methylsilane is increased to 68 sccm and a second oxidized methylsilane layer containing about 10.5% carbon by atomic weight and about 3% hydrogen by atomic weight is deposited at a power level of 80 W, the second layer having a thickness of at least 1000 Å. Then the flow of methysilane is decreased to 34 sccm and deposition of a third oxidized methylsilane layer containing about 5% carbon and 0.3% hydrogen is deposited at a power level of 300 W, the layer having a thickness of at least 5000 Å. The deposited dielectric layers are then cured at 400° C. to remove remaining moisture and the substrate is transferred for etching of a dual damascene structure.

In a conventional photolithographic process, a photoresist, such as "RISTON," manufactured by duPont de Nemours Chemical Company, is applied on the third oxidized methylsilane layer to a thickness of about 0.4 to about 1.3 micron, and the vias to be etched in the dielectric layers are defined by exposing the resist to a pattern of light through a mask that corresponds to the desired configuration of features. The dielectric layers below the unexposed portions of the resist are etched in an IPS ETCH chamber, available from Applied Materials Inc., using the following amounts of process gases:

| | |
|---|---|
| $C_4F_8$, at | 20 sccm |
| $CF_4$, at | 40 sccm |
| CO, at | 150 sccm |
| Argon Ar, at | 250 sccm. |

The patterned substrate was placed on the cathode pedestal of the etch chamber, and the chamber was maintained at a pressure of about 30 mTorr. A plasma was generated by applying a RF voltage to the dual solenoid coil at a power level of about 2000 Watts. A bias power of 1000 Watts was applied to the cathode pedestal. The substrate was cooled or heated to −10° C. using a flow of backside helium to maintain a thin layer of passivating deposits on the sidewalls of freshly etched features. The etching process was performed for a sufficient time to etch vias in the third oxidized methylsilane layer. Then etching of the via continued through the second oxidized methylsilane layer at 30 mTorr with the following gas flows:

| | |
|---|---|
| $C_4F_8$, at | 0 sccm |
| $CF_4$, at | 60 sccm |
| CO, at | 150 sccm |
| Argon Ar, at | 250 sccm. |

The etching process was performed for a sufficient time to etch through the second oxidized methylsilane layer. Then etching continued through the first oxidized methysilane layer at 30 mTorr with the following gas flows:

| | |
|---|---|
| $C_4F_8$, at | 20 sccm |
| $CF_4$, at | 40 sccm |
| CO, at | 150 sccm |
| Argon Ar, at | 250 sccm. |

The etching process was performed for a sufficient time to etch through the first oxidized methysilane layer. Then over-etching was performed with the following changes in flow rates:

| | |
|---|---|
| $C_4F_8$, at | 20 sccm |
| $CF_4$, at | 40 sccm |
| CO, at | 100 sccm |
| Argon Ar, at | 250 sccm. |

The overetching process was performed at a dual solenoid power level of 1600 W and a cathode pedestal power level of 1000 W for a sufficient time to complete all vias through the first oxidized methysilane layer.

SEM photos of the etched wafers were used to measure (i) the dielectric etch rate, (ii) the etching selectivity ratio of the dielectric etching to photoresist etching, (iii) etch rate uniformity, and (iv) the % etch rate microloading. Results are shown below for the via etch steps. Etch rates were calculated by measuring the depth of the features etched in the substrates. The etching selectivity ratio was calculated from the ratio of the etch rate of the dielectric layers 20 to the etch rate of the photoresist layer. The etch rate uniformity was calculated using at least 15 different measured points. The % etch rate microloading is a measure of the difference in etch rates obtained when etching features having different sizes on the substrates. In the examples below, percent etch rate microloading was measured for large holes having diameters of about 0.5 microns and small holes having diameters of about 0.25 microns, the etch rates being averaged for the center and peripheral edge of the substrates.

The old photoresist is then stripped by an oxygen plasma and a photoresist is re-applied and patterned to define horizontal interconnects such as trenches. The dielectric layer below the unexposed portions of the resist are selectively etched down to the etch stop layer in the IPS ETCH chamber, using the following amounts of process gases at a chamber pressure of 7 mTorr:

| | |
|---|---|
| $C_4F_8$, at | 19 sccm |
| $CF_4$, at | 0 sccm |
| CO, at | 0 sccm |
| Argon Ar, at | 100 sccm. |

A plasma was generated by applying a RF voltage to the dual solenoid coils having a power level of about 1400 Watts. The cathode pedestal power level was set at 1500 Watts. The substrate was cooled or heated to +10° C. using a flow of backside helium to maintain a thin layer of passivating deposits on the sidewalls of freshly etched features. The etching process was performed for a sufficient time to etch all trenches through the third oxidized methylsilane layer.

As an alternative, etching of the trenches could start at a higher pressure such as 20 mTorr by increasing gas flows about 50% and increasing power to the solenoid coils by about 1000 W, then etch conditions could be altered to a lower pressure such as 7 mTorr for less aggressive etching of the trench to ensure stopping on the second oxidized methysilane layer.

SEM photos of the etched wafers were again used to measure the etch performance and results are shown below for each of the etch steps.

TABLE 2

Etch Performance for Example 1

| | Via-1st | Via 2nd | Via-3rd | OE | Trench |
|---|---|---|---|---|---|
| Etch Rate, Å/min | 750 | 1,200 | 750 | 1,700 | 2,400 |
| Selectivity | 3:1 | 3.5:1 | 3:1 | 3.5:1 | 1.2: |
| Uniformity | ±10% | ±5% | ±10% | ±5% | ±5% |
| μ-loading | —% | 10% | —% | 10% | 15% |

EXAMPLE 2

The preceding example deposits the dielectric layers in a single chamber by varying only the flow of the silicon compound and the power level. This example modifies the first example by replacing methylsilane with TEOS for the first dielectric layer as follows.

A first oxidized TEOS layer is deposited on an 8 inch silicon substrate placed in a DxZ chamber, available from Applied Materials, Inc., at a chamber pressure of 3.0 Torr and temperature of 350° C. from reactive gases which are flowed into the reactor as follows:

| | |
|---|---|
| TEOS, $(CH_3$—$CH_2$—O—$)_4$—Si, at | 40 sccm |
| Oxygen, $O_2$, at | 360 sccm |
| Helium, He, at | 2000 sccm. |

The substrate is positioned 320 mil from the gas distribution showerhead and 750 W of high frequency RF power (13 MHz) is applied to the showerhead for plasma enhanced deposition of a silicon oxide layer containing less than 1% carbon by atomic weight and less than 0.1% hydrogen by atomic weight, the layer having a thickness of at least 5000 Å. Then deposition of second and third dielectric layers then continues using methysilane as described for Example 1.

Etching of a dual damascene structure is performed as described in Example 1 except that the etch conditions for forming vertical interconnects in the deposited TEOS layer and for an overetch of the vertical interconnects are as follows:

| | |
|---|---|
| C$_4$F$_8$, at | 15 sccm |
| C$_2$F$_6$, at | 20 sccm |
| CO, at | 0 sccm |
| Argon Ar, at | 350 sccm. |

During etching of the lower silicon oxide layer and the over-etching of the vertical interconnects, a plasma is generated by applying 2200 W of RF power to the dual solenoid coils and 1400 W of RF power to the bias electrode. The substrate is cooled or heated to −10° C. using a flow of backside helium to maintain a thin layer of passivating deposits on the sidewalls of freshly etched features.

While the foregoing is directed to preferred embodiments of the present invention, other and further embodiments of the invention may be devised without departing from the basic scope thereof, and the scope thereof is determined by the claims which follow.

What is claimed is:

1. A process for depositing and etching intermetal dielectric layers, comprising:
    depositing a first dielectric layer comprising silicon, oxygen and carbon and having a dielectric constant less than about 4.0;
    depositing a second dielectric layer comprising silicon, oxygen and carbon and having a dielectric constant less than about 4.0 on the first dielectric layer; and
    etching the second dielectric layer under conditions wherein the second dielectric layer has an etch rate that is greater than an etch rate for the first dielectric layer.

2. The process of claim 1, wherein the first dielectric layer comprises silicon, oxygen, and at least about 5% carbon by atomic weight, and the second dielectric layer comprises silicon, oxygen, and less than about two-thirds of the carbon contained in the first dielectric layer.

3. The process of claim 2, wherein the first dielectric layer is etched to form vertical interconnects with a first gas mixture comprising one or more fluorocarbon compounds and one or more carbon:oxygen compounds, and the second dielectric layer is etched to form horizontal interconnects with a second gas mixture comprising one or more fluorocarbon compounds and essentially no carbon:oxygen compounds.

4. The process of claim 3, wherein the carbon:oxygen compound is carbon monoxide.

5. The process of claim 1, wherein the first dielectric layer comprises silicon, oxygen, carbon, and at least 1% hydrogen by atomic weight, and the second dielectric layer comprises silicon, oxygen, carbon, and less than one-fifth of the hydrogen contained in the first dielectric layer.

6. The process of claim 5, wherein the first dielectric layer is etched to form vertical interconnects with a first gas mixture comprising one or more fluorocarbon compounds and one or more carbon:oxygen compounds, and the second dielectric layer is etched to form horizontal interconnects with a second gas mixture comprising one or more fluorocarbon compounds and essentially no carbon:oxygen compounds.

7. The process of claim 6, wherein the carbon:oxygen compound is carbon monoxide.

8. The process of claim 1, wherein the first and second dielectric layers are deposited by oxidizing an organosilicon compound.

9. The process of claim 8, wherein the organosilicon compound is methylsilane or hexamethyldisiloxane.

10. The process of claim 1, wherein the first dielectric layer is deposited on a third dielectric layer having a dielectric constant less than about 4.0.

11. A process for depositing low dielectric constant layers, comprising:
    varying one or more process conditions for depositing an organosilicon compound to obtain first and second dielectric layers having varying silicon, oxygen, carbon, and hydrogen contents and dielectric constants less than about 4; and
    etching the second dielectric layer using conditions wherein the second dielectric layer has an etch rate that is greater than an etch rate for the first dielectric layer.

12. The process of claim 11, wherein the first dielectric layer contains at least 5% carbon by atomic weight or at least 1% hydrogen by atomic weight, and wherein the second dielectric layer contains less than two-thirds of the carbon in the first silicon oxide layer or less than one-fifth of the hydrogen in the first silicon oxide layer.

13. The process of claim 12, wherein the second dielectric layer is etched to form horizontal interconnects with a first gas mixture comprising one or more fluorocarbons and essentially no carbon:oxygen compounds.

14. The process of claim 11, further comprising:
    depositing the first dielectric layer on a third dielectric layer having silicon, oxygen, carbon, and hydrogen contents similar to the second dielectric layer.

* * * * *

UNITED STATES PATENT AND TRADEMARK OFFICE
CERTIFICATE OF CORRECTION

PATENT NO.   : 6,669,858 B2
DATED        : December 30, 2003
INVENTOR(S)  : Bjorkman et al.

It is certified that error appears in the above-identified patent and that said Letters Patent is hereby corrected as shown below:

<u>Title page,</u>
Item [75], Inventors, please change "Min Melissa Yu" to -- Melissa Min Yu -- and change "Hongquing" to -- Hongqing --.

Signed and Sealed this

Fifteenth Day of June, 2004

JON W. DUDAS
*Acting Director of the United States Patent and Trademark Office*